(12) United States Patent
Sinha et al.

(10) Patent No.: US 7,211,369 B2
(45) Date of Patent: *May 1, 2007

(54) VLSI-BASED SYSTEM FOR DURABLE HIGH-DENSITY INFORMATION STORAGE

(76) Inventors: Pawan Sinha, 100 Memorial Dr., Apt. 8-4C, Cambridge, MA (US) 02142; Pamela R. Lipson, 217 Thorndike St., Apt. 109, Cambridge, MA (US) 02141; Keith R. Kluender, 5718 Tolman Ter., Madison, WI (US) 53711

(*) Notice: Subject to any disclaimer, the term of this patent is extended or adjusted under 35 U.S.C. 154(b) by 0 days.

This patent is subject to a terminal disclaimer.

(21) Appl. No.: 10/727,872

(22) Filed: Dec. 3, 2003

(65) Prior Publication Data

US 2004/0250233 A1 Dec. 9, 2004

Related U.S. Application Data

(63) Continuation of application No. 09/662,300, filed on Sep. 15, 2000, now Pat. No. 6,680,162.

(60) Provisional application No. 60/154,401, filed on Sep. 17, 1999.

(51) Int. Cl.
*G03F 7/00* (2006.01)
*G03F 9/00* (2006.01)
*G06F 17/50* (2006.01)

(52) U.S. Cl. ............ 430/311; 430/322; 430/22; 430/9; 716/19; 716/20; 716/21

(58) Field of Classification Search ......... 430/311, 430/22, 322; 716/19–21
See application file for complete search history.

(56) References Cited

U.S. PATENT DOCUMENTS 3,626,824 A * 12/1971 Kolb et al. ............... 396/550
6,629,292 B1 * 9/2003 Corson et al. ............ 716/3
6,680,162 B1 * 1/2004 Sinha et al. .............. 430/311

OTHER PUBLICATIONS

Hey "Richard Feynman and Computation", Contemporary Physics, 1999, vol. 40, No. 4, p. 257-265 (Jul. 1999).*

* cited by examiner

*Primary Examiner*—Sin Lee
(74) *Attorney, Agent, or Firm*—Townsend and Townsend and Crew LLP

(57) ABSTRACT

The invention relates to using VLSI techniques to store information on a substrate. One embodiment of a die with text deposited upon the die uses semiconductor processing techniques during fabrication. Included in the die are a substrate, a first paragraph and a second paragraph. The first and second paragraphs are in contact with the substrate. The second paragraph is aligned with the first paragraph in a column.

29 Claims, 8 Drawing Sheets

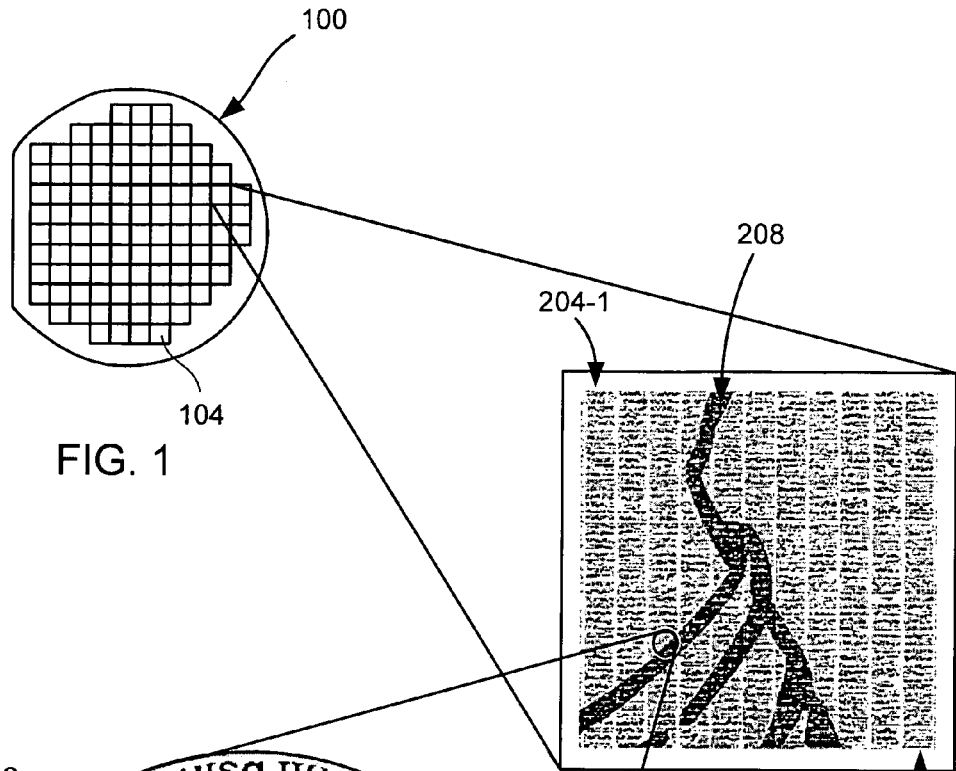
FIG. 1
FIG. 2
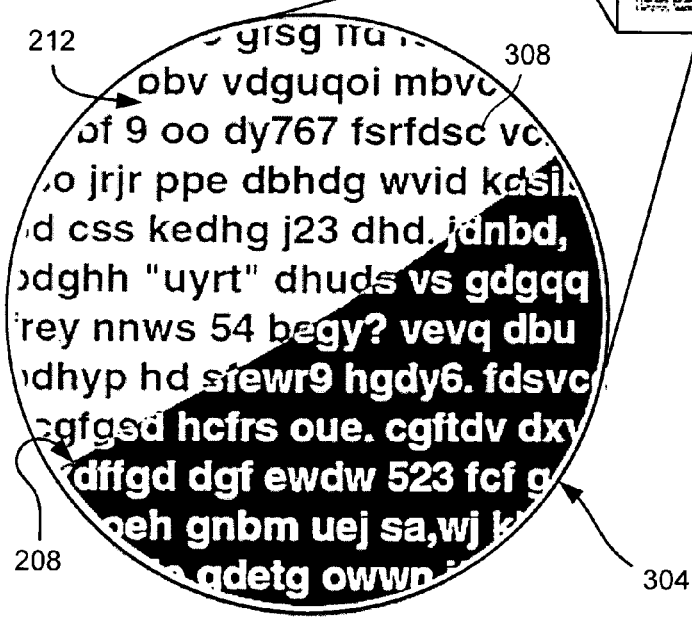
FIG. 3

VLSI-BASED SYSTEM FOR DURABLE HIGH-DENSITY INFORMATION STORAGE

This application is a continuation of Ser. No. 09/662,300 filed Sep. 15, 2000 now U.S. Pat. No. 6,680,162, which is a non-provisional of U.S. Provisional Patent Application No. 60/154,401 filed Sep. 17, 1999 both of which are hereby incorporated by reference herein.

BACKGROUND OF THE INVENTION

This invention relates in general to VLSI fabrication techniques and, more specifically, to using these techniques to store information.

Any unnecessary traces of a metal, an oxide or a polysemiconductor are avoided in semiconductor processing. Adding unnecessary traces makes the mask and fabrication more complex. This added complexity can increase the likelihood of defects in the finished semiconductor circuit. Consequently, semiconductor circuits avoid use of unnecessary traces.

Progress in VLSI technology over the past few decades has been phenomenal. Packing densities have increased by several orders of magnitude. However, to date, VLSI technology has been used largely for creating electronic circuits, micro-machines or sensors. Other uses for the VLSI technology are needed.

SUMMARY OF THE INVENTION

The invention relates to using VLSI techniques to store information on a substrate. One embodiment of a die with text deposited upon the die uses semiconductor processing techniques during fabrication. Included in the die are a substrate, a first paragraph and a second paragraph. The first and second paragraphs are in contact with the substrate. The second paragraph is aligned with the first paragraph in a column.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings.

BRIEF DESCRIPTION OF THE DRAWINGS

FIG. 1 is a depiction of an embodiment of a wafer having multiple die;

FIG. 2 is a depiction of an embodiment of a die from the wafer;

FIG. 3 is an illustration of an embodiment of a portion of a column from the die

DESCRIPTION OF THE SPECIFIC EMBODIMENTS

Figure 4:
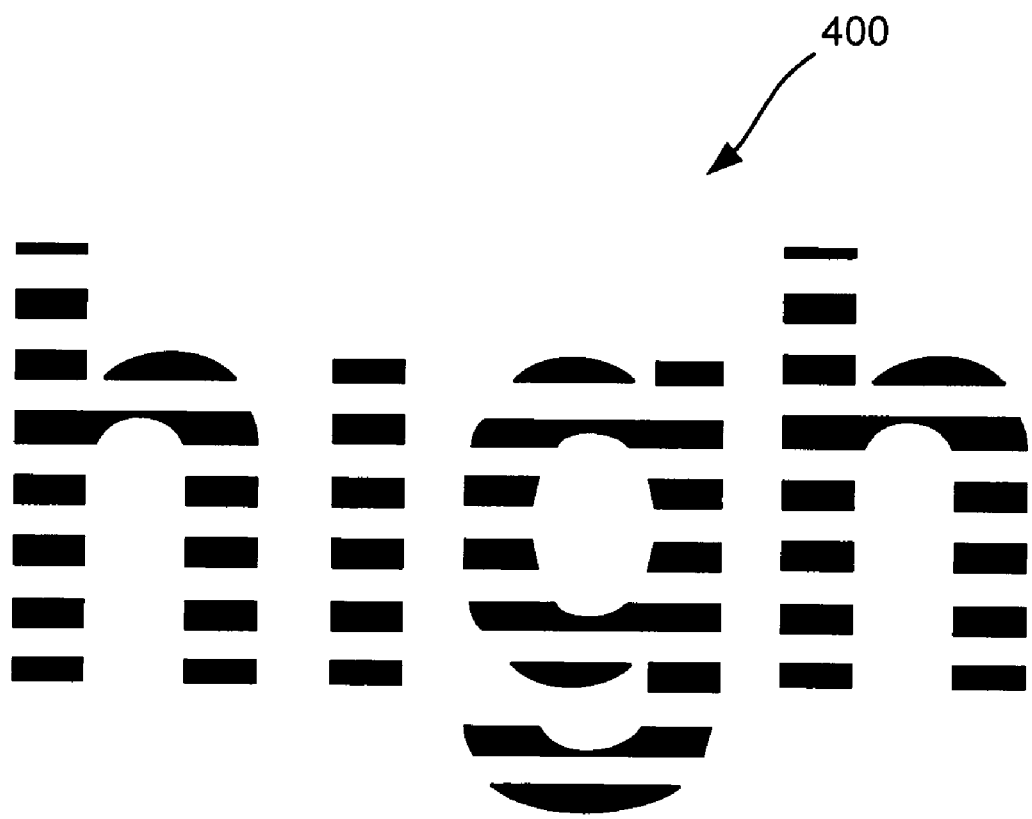
FIG. 4 is an illustration of an embodiment of a word having diffraction gratings.

The present invention includes a novel use of Very Large Scale Integration (VLSI) technology for creating very durable and long-term repositories of textual and graphical information. The invention allows converting the information to be stored into an input form suitable for VLSI fabrication systems, allows fabricating the information repositories and allows accessing the stored information. The invention creates features representing textual and/or graphical information on a semiconductor (or other) wafer. These features may be created on the wafer surface itself or on a layer of material deposited on the wafer surface. Such materials can include, but are not limited to, metals, oxides and photoresists. In this way, large amounts of text are archived using VLSI technology.

In the Figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

Referring first to FIG. 1, a depiction of an embodiment of a wafer 100 having multiple die 104 is shown. The die 104 are generally aligned in a grid across the wafer 100. Typically, all die 104 on the wafer 100 are the same. Although the die 104 in this embodiment is rectangular, other embodiments could have die of different shapes. For example, the die could be shaped as star or cross.

With reference to FIG. 2, a depiction of an embodiment of a die 104 from the wafer 100 is shown. Approximately eleven columns 204 of text appear on the die 104. Each column 204 includes a number of paragraphs. Each paragraph is separated by a hard return and a tab. In some cases the first character of a section or chapter is enlarged and/or ornately decorated to signify changing sections or chapters. A dark silhouette pattern 208 against a lighter background overlays the columns 204 of text. The silhouette pattern 208 is darker than the background in this embodiment, but other embodiments could reverse this. Although this embodiment shows an English character set, other embodiments could include character sets in any language as well as symbol character sets.

The features, once created on the wafer, can be overlaid with an optically clear protective coating using materials such as a resin, an optically clear overcoat (e.g., EXP980024 available from Brewer Science™ of Missouri), a thin and clear nitride film, a spin-on glass film, or an aluminum oxide layer. Additionally, the back surface of the wafer can be metallized to add durability to the typically fragile wafer 100.

Referring next to FIG. 3, an illustration of an embodiment of a portion 212 of a column 204 from the die 104 is shown. The portion 212 is a magnification of a part of FIG. 2 that shows a test sample of text 308. The portion 212 shows the dividing line 316 between the silhouette 208 and the background 312. To allow for contrast, the text 308 on the silhouette 208 is a light color and the text 308 on the background 312 is a dark color.

With reference to FIG. 4, an illustration of an embodiment of a word 400 having diffraction grating subpattern is shown. By adjusting the spacing of the diffraction gratings, the word 400 or character appears in different colors. The minimum size of the features is limited only by the capabilities of the VLSI fabrication technology used. For example, one-hundred and thirty nanometer features are being used today. In addition to colors, other embodiments could use bolding, underlining, italics, strikeout, subscripts, superscripts, shadows, small caps and other effects with the text 308. Further, the diffraction lines the produce the different colors could be oriented at any angle with respect to the text 308 and not just horizontally as depicted in this embodiment.

Figure 5:
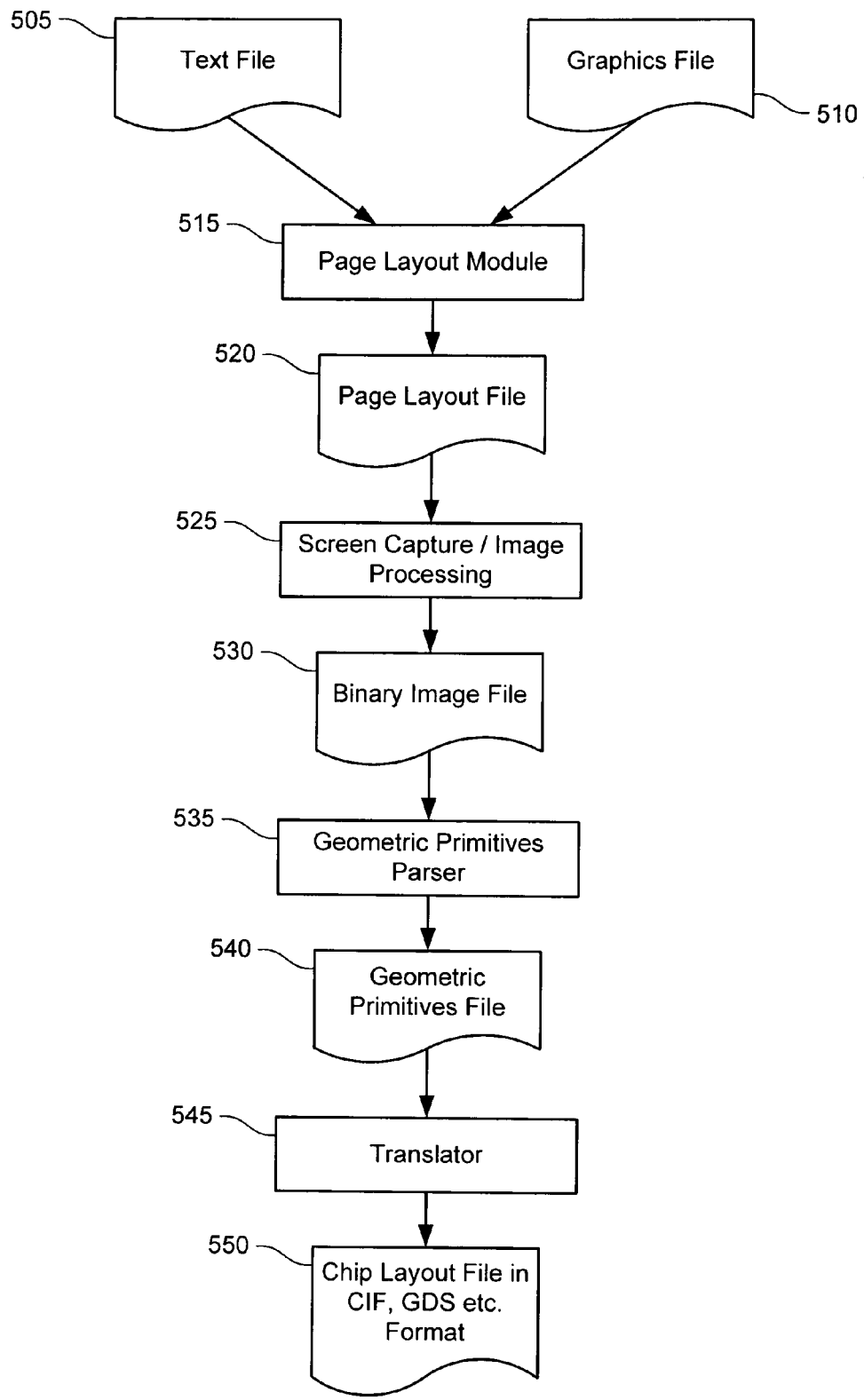
FIG. 5 is a flow diagram of an embodiment of a process for converting text and graphics into an electronic mask file.

Referring next to FIG. 5, a flow diagram of an embodiment of a process for converting text and graphics into an electronic mask file is shown. The process begins in step 515 where a text file 505 and graphics file 510 are chosen and loaded into page layout software. The text 505 is in a file format such ASCII text or rich text. Included in the text file 505 are hard returns between paragraphs and markers for the beginning of a section or chapter. The graphics file 510 is preferably a two color silhouette.

Page layout software such as Adobe PageMaker™ or Quark Xpress™ is used to create and lay-out the text and graphics in a space proportional in size to the dimensions of the desired die 104. The resolution of the drawing in the page layout software is chosen such that it corresponds to the feature size of the semiconductor process. The number of columns needed and font size for adequate resolution is chosen with the page layout software. A page layout file 520 is produced from the software in step 515.

In step 525, the page layout file 520 is converted into a binary image file 530. This can be done using a screen capture program and an image manipulation program such as Hijaak Pro™ or Adobe PhotoShop™. Alternatively, custom software could perform this conversion to the binary image file 530. In this embodiment, each pixel in the binary image corresponds to a rectangle in the die layout.

In step 535, the text and graphical regions of binary image file 530 are represented as a collection of simple geometric primitives in a geometric primitives file 540 that can be fabricated with the available fabrication technology. Primitives such as rectangles are used in this embodiment to represent each pixel, but in other embodiments can also include general polygons, triangles, lines, curves, and circles. In alternative embodiments, several like and adjacent pixels can be grouped into larger primitives.

In addition to a binary image file, diffraction patterns and color materials, for example, could be used to change the color of a graphical image. Some embodiments could change the processing materials to suit the desired colors of the graphical image. Alternatively, colors in the graphical image could signify a different shaped primitive (e.g., a circle) or signify a different style.

In step 545, each geometric primitive in the file 540 is translated into a basic chip layout command such as a "Box" command (corresponding to rectangles) in the CIF language to produce a CIF or GDS file 550. In addition to the CIF and GIF format, any other chip layout format could be used. The complete collection of primitives corresponding to the whole binary file would, by this process, result in a list of "Box"-like commands. It is noted, we use the phrase 'box command' to mean any of a variety of commands corresponding to simple geometric primitives in the rest of this document. This list constitutes the chip layout file, which can be used by a VLSI fabrication facility to create the patterns for the masks used in lithographing the die 104.

Figure 6:
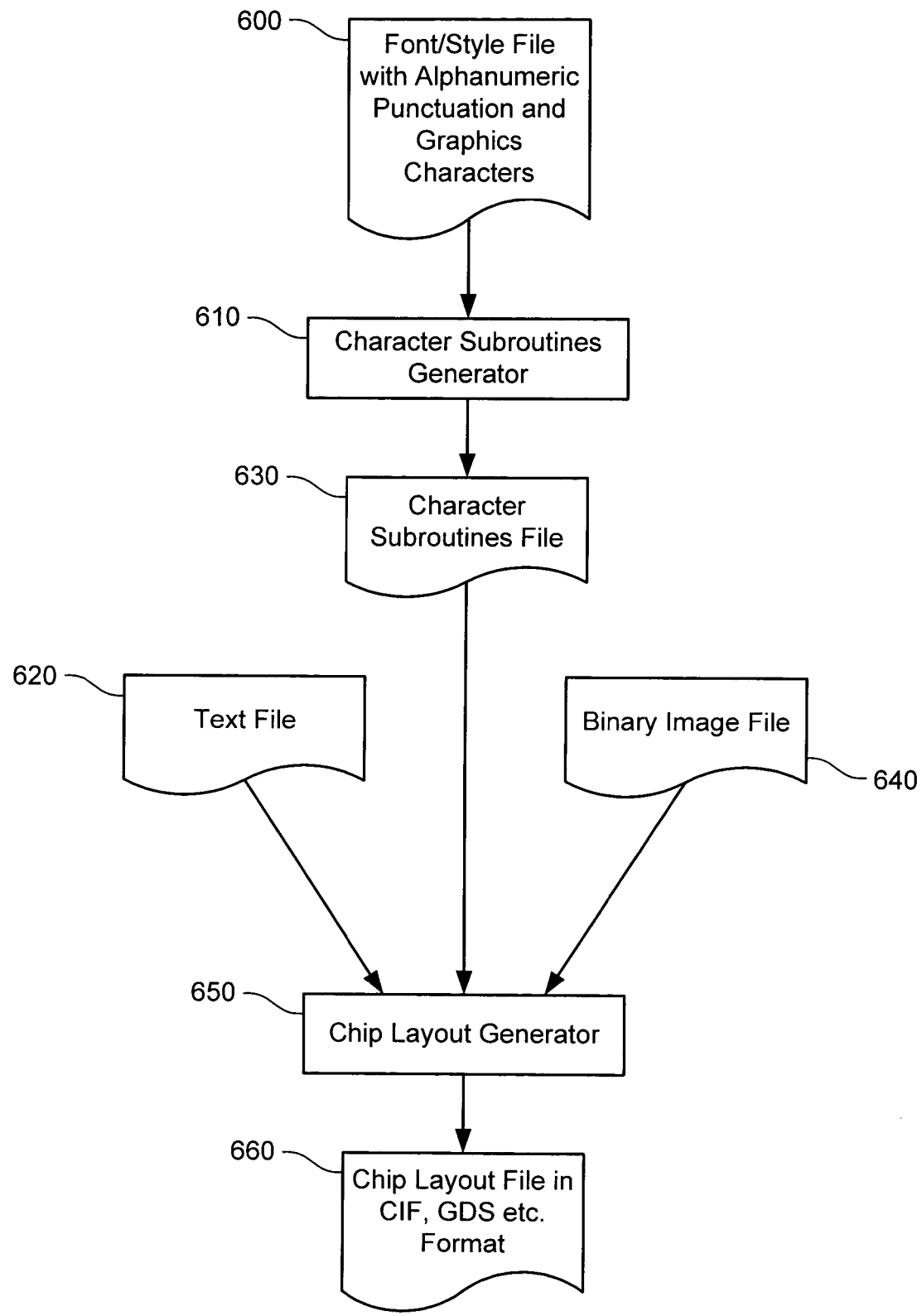
FIG. 6 is a flow diagram of another embodiment of a process for converting text and graphics into an electronic mask file.

With reference to FIG. 6, a flow diagram of another embodiment of a process for converting text and graphics into an electronic mask file is shown. The process begins in step 610 where for each of the elements (e.g. letters of the alphabet, punctuation marks, numerals, and graphic characters) a binary pattern that represents that character is generated for a particular font in a font/style file 600. All these binary patterns are collected into one or more 'font/style files'. For each element of the font/style files 600, a list of primitives that make the element is generated. This yields a "subroutine" for generating that element.

The list of primitives that make up an element can be generated in a variety of ways. In one embodiment, each pixel of the element is treated as a separate rectangular primitive. The primitives generated from the font/style file 600 are stored in a character subroutine file 630. Some embodiments may include special features in the character subroutine file 630 such as printing a special character at the beginning of a chapter or section. At this point in the process, the text can be processed to produce characters in the desired font.

A text file 620, the character subroutines file 630 and a binary image file 640 are loaded into the chip layout generator in step 650 to produce a chip layout file 660. In this embodiment, the text file is an ASCII file and the binary image file is a TIFF file. If only a text file 620 is specified without a binary image file 640, each element in the text file 620 is read and corresponding subroutine from the character subroutine file 630 is looked-up. The sequence of elements is translated into the corresponding sequence of subroutine calls and a chip layout file is created. The set of subroutine calls may be appended to the subroutines.

If only a binary image or graphics file 640 is specified without a text file 620, each pixel in the graphics file 640 is read and translated into an appropriate 'box' command. These 'box' commands form a chip layout file 660.

In some instances, a graphics file 640 may be combined with a text file 620 to create a chip layout file 660. There are several options for accomplishing this. One option is to have the text wrap around the graphics. The graphic itself is represented as a collection of geometric primitives like rectangles. By knowing the position of the graphics, the text can be wrapped around the graphics.

Another option is to have the text overlay the graphic, but to have the text change polarity (normal or reverse contrast) depending on whether it is inside or outside the graphic element. The text may change features other than polarity.

For instance, it could change style (normal or bold), change fonts (e.g. Geneva to Helvetica), or change from one type of element to another. Once the style or type of element is determined from both the graphics and text file, the appropriate subroutine is looked up from set of subroutines generated in the character subroutine file 630 and outputted to the chip layout file 660.

The mask corresponding to the chip layout file 660 described above (e.g., CIF or GDS format) can be created using E-Beam Lithography, X-Ray Lithography, or any of a variety of techniques commonly used now or in the future for VLSI. The input to the process is the chip layout file 660 and the polarity of the mask. The mask can be a 1-to-1 contact mask or a minification mask suitable for use in a stepper configuration.

Figure 7:
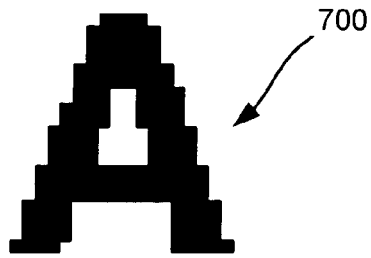
FIG. 7 is a depiction of an embodiment of an upper case "A" element.
Figure 9:
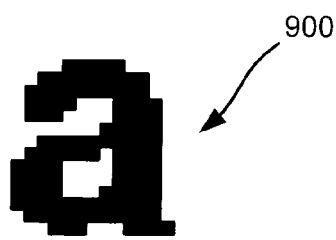
FIG. 9 is a depiction of an embodiment of a lower case "a" element.

Referring next to FIG. 7, a depiction of an embodiment of an upper case "A" element 700 is shown. The element 700 approximates the font Helvetica using a number of rectangles. Other embodiments could use other fonts. The black regions denote "pixels" of the element. Similarly, FIG. 9 shows a depiction of an embodiment of a lower case "a" element 900.

Figure 8:
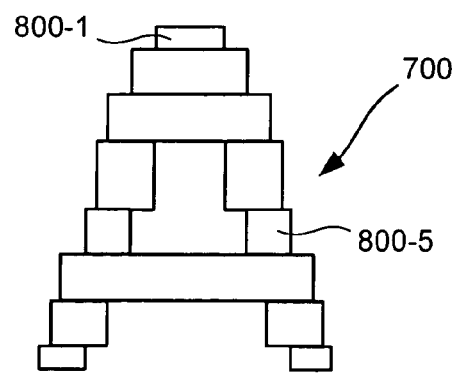
FIG. 8 is a depiction of the embodiment of the upper case "A" element showing constituent rectangle primitives.

With reference to FIG. 8, a depiction of the embodiment of the upper case "A" element 700 showing constituent rectangle primitives 800 is shown. The primitives 800 are rectangles of different sizes positioned to approximate the element 700. Each primitive is comprised of "box" commands each being a square defined by the feature size of the process. Some embodiments are not limited by the feature size of the process. Since the die is not a functional circuit, the only limitation on size and shape is defined by the state of the art in mask fabrication. Although this embodiment uses rectangular primitives, other embodiments could have primitives of any geometric shape.

Figure 10:
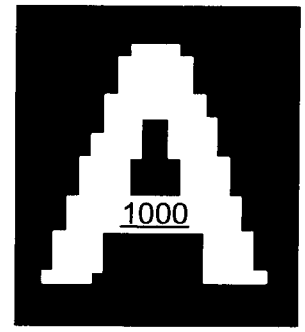
FIG. 10 is a depiction of an embodiment of a upper case "A" element with reverse contrast.
Figure 11:
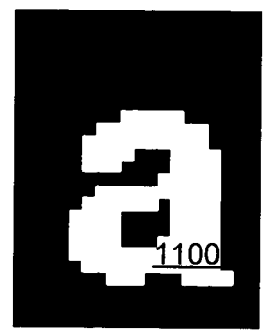
FIG. 11 is a depiction of an embodiment of a lower case "a" element with reverse contrast.

Referring next to FIGS. 10 and 11, shown are depictions of embodiments of an upper case "A" and a lower case "a" elements 1000, 1100 with reverse contrast. Reverse contrast provides contrast for text overlaying a dark background or a dark silhouette.

Figure 12:
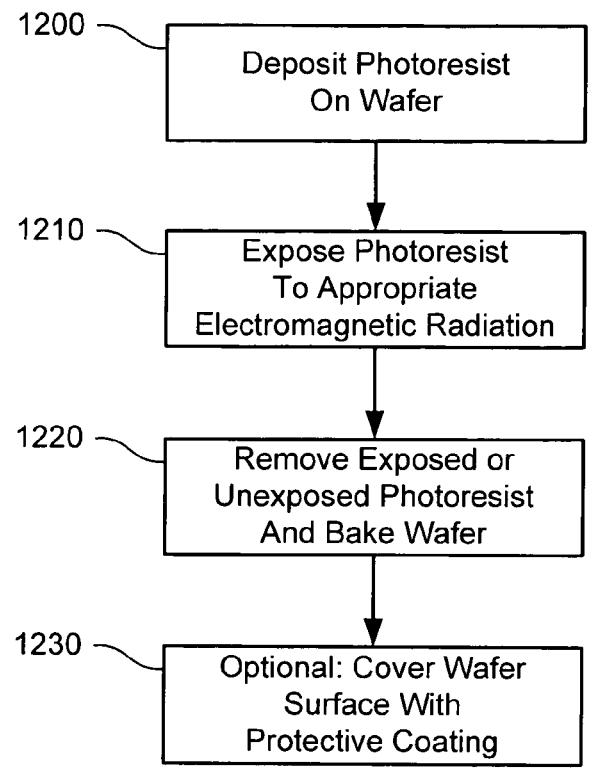
FIG. 12 is a flow diagram of an embodiment of a process for lithographing text and/or graphics onto a semiconductor substrate.

With reference to FIG. 12, a flow diagram of an embodiment of a process for lithographing text and/or graphics onto a semiconductor substrate is shown. A variety of methods can be used for fabricating chips 104 based on mask described above. The process begins in step 1200 by depositing photoresist directly on the wafer or on a layer of some other material that has first been deposited on the wafer. Next, expose the photoresist to electromagnetic radiation of the appropriate wavelength through the mask in step 1210. Etch away the exposed or unexposed photoresist to leave a positive or negative impression and bake the photoresist to increase its durability in step 1220. Optionally, the wafer is coated with an optically clear protective material.

Figure 13:
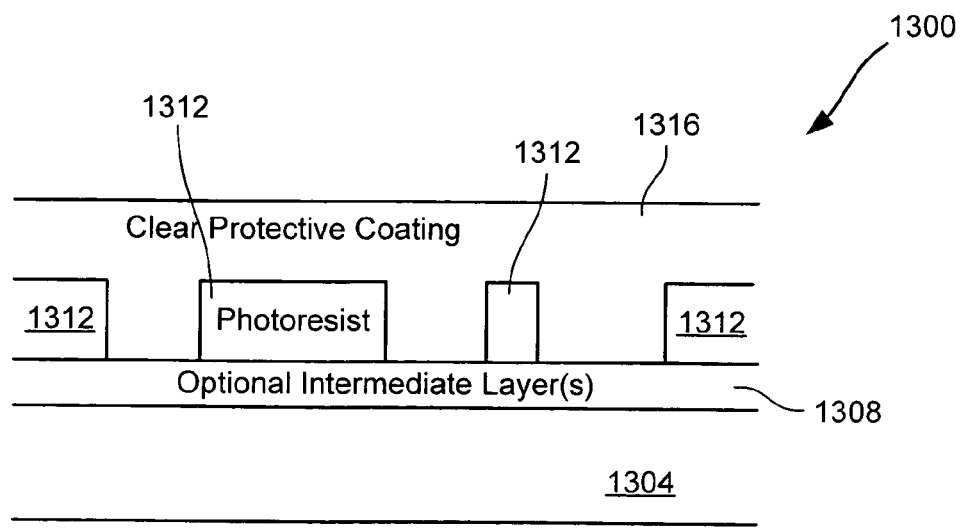
FIG. 13 is a side elevational view of an embodiment of a semiconductor wafer with text and/or graphics lithographed thereon.

Referring next to FIG. 13, a side elevational view of an embodiment of a semiconductor wafer 1300 with text and/or graphics lithographed thereon is shown. To produce the semiconductor wafer 1300 depicted; the process of FIG. 12 was employed. The bottommost portion is a substrate 1304. An optional intermediate layer(s) 1308 may be deposited upon the substrate 1304. A photoresist pattern 1312 is on the optional intermediate layer(s) 1308. A clear protective coating 1316 envelopes the photoresist 1312.

Figure 14:
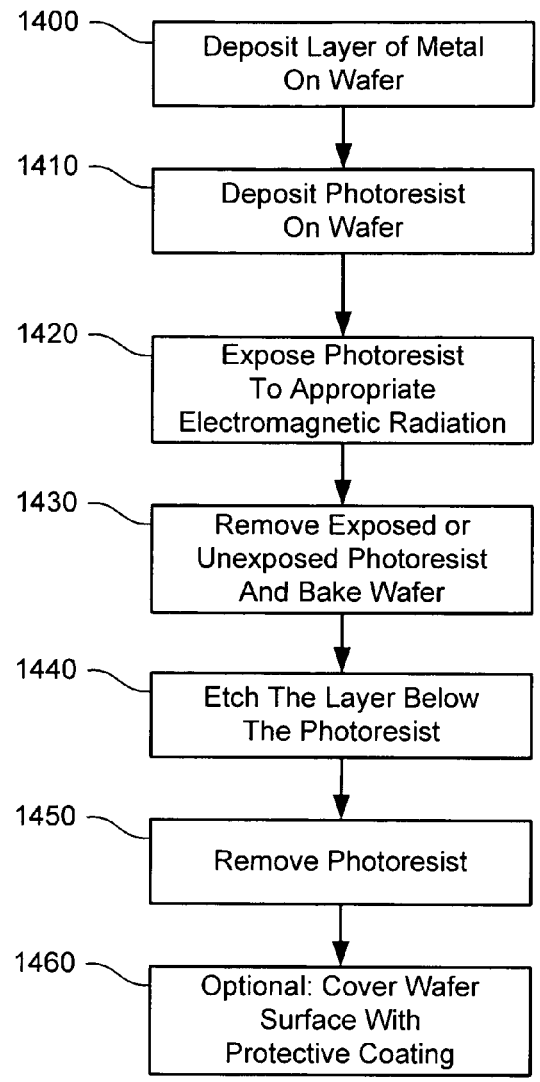
FIG. 14 is a flow diagram of another embodiment of a process for lithographing text and/or graphics onto a semiconductor substrate.

With reference to FIG. 14, a flow diagram of another embodiment of a process for lithographing text and/or graphics onto a semiconductor substrate is shown. The process begins in step 1400 where one or more layers of materials such as metals or polysilicons are deposited on the substrate. Next, photoresist is deposited in step 1410. In step 1420, the photoresist is exposed to electromagnetic radiation of the appropriate wavelength through the mask.

Etch away the exposed or unexposed photoresist to leave a positive or negative impression in step 1430. The layer below the photoresist is etched through the cavities created in the photoresist layer in step 1440. Any photoresist left behind is removed to reveal the patterned layer of material in step 1450. Optionally, coat the wafer with an optically clear protective material in step 1460.

Figure 15:
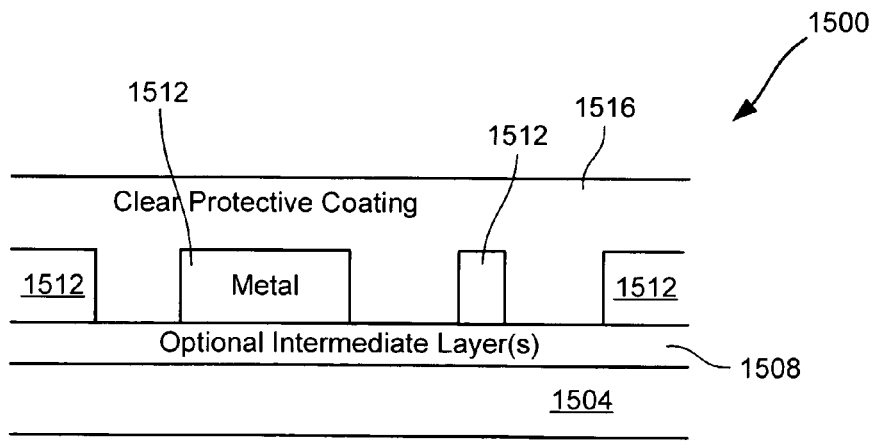
FIG. 15 is a side elevational view of another embodiment of a semiconductor wafer with text and/or graphics lithographed thereon.

Referring next to FIG. 15, a side elevational view of another embodiment of a semiconductor wafer 1500 with text and/or graphics lithographed thereon is shown. To produce the semiconductor wafer 1500 depicted, the process of FIG. 14 was employed. The bottommost portion is a substrate 1504. An optional intermediate layer(s) 1508 may be deposited upon the substrate 1504. A metal pattern 1512 is on the optional intermediate layer(s) 1508. A clear protective coating 1516 envelopes the metal pattern 1512.

Figure 16:
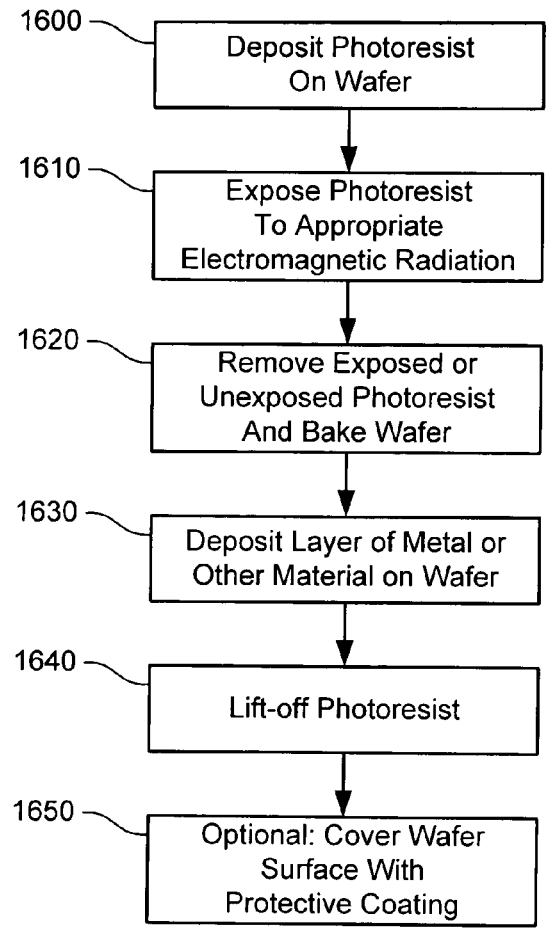
FIG. 16 is a flow diagram of yet another embodiment of a process for lithographing text and/or graphics onto a semiconductor substrate.

With reference to FIG. 16, a flow diagram of yet another embodiment of a process for lithographing text and/or graphics onto a semiconductor substrate is shown. The process begins in step 1600 where photoresist is deposited directly on the substrate or on a layer of some other material that has first been deposited on the substrate. In step 1610, the photoresist is exposed to electromagnetic radiation of the appropriate wavelength through the mask. The exposed or unexposed photoresist is etched away in step 1620 to leave a positive or negative impression. Next, a material such as a metal or a polysilicon is deposited on the patterned photoresist in step 1630. The photoresist is lifted off in step 1640 leaving behind the material from step 1630 in the cavities of the photoresist pattern. Optionally, the wafer is coated with an optically clear protective material in step 1650.

Figure 17:
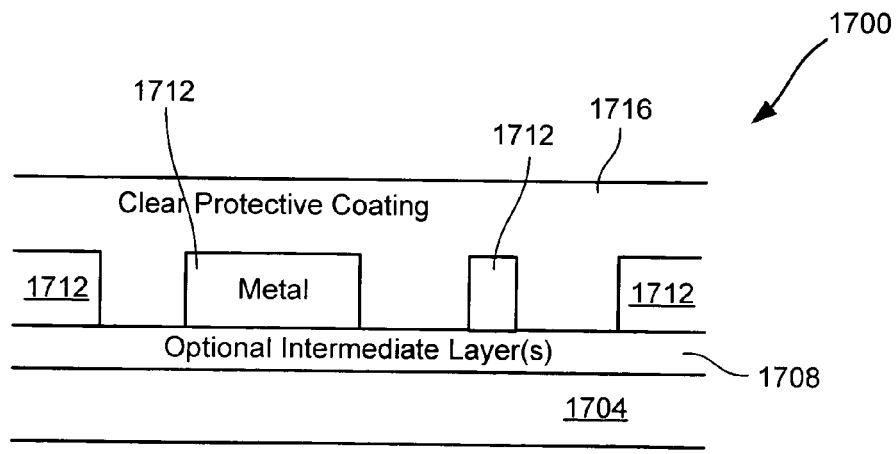
FIG. 17 is a side elevational view of yet another embodiment of a semiconductor wafer with text and/or graphics lithographed thereon.

Referring next to FIG. 17, is a side elevational view of yet another embodiment of a semiconductor wafer with text and/or graphics lithographed thereon is shown. To produce the semiconductor wafer 1700 depicted, the process of FIG. 16 was employed. The bottommost portion is a substrate 1704. An optional intermediate layer(s) 1708 may be deposited upon the substrate 1704. A metal pattern 1712 is on the optional intermediate layer(s) 1708. A clear protective coating 1716 envelopes the metal pattern 1712.

The information stored in text and graphics may be accessed. A magnification device equipped with an illuminator that can cast light on the chip from above can be used to aid the human eye to see the fine details of the information on the chip. The chip can be mounted on a stage capable of precise movements under the magnifying device. The magnification device may be coupled to an electronic or photographic capture device, such as a film camera or an electronic camera.

If the chip is imaged by the magnification device and captured by an electronic capture device, the resulting electronic image may be processed. For instance, one could compare the electronic images of two chips to see if they are identical. This capability could be used for access control or security applications. One could also perform automated character recognition. The output could be printed, searched for specific items or translated into an audio signal and transmitted so that the chip could be "read out loud" to a human or a listening device.

In light of the above description, a number of advantages of the present invention are readily apparent. First, the density of information storage can be very high. This is due to the very small features that can be fabricated with modern VLSI technology. Second, the information storage is very durable against disruptive influences such as radioactivity, strong electromagnetic fields, high temperatures, moisture, chemicals and mechanical strain. Existing means of information storage, such as magnetic discs, tapes and CDs tend to fall prey to one or more of these factors. In fact, even electronic memories fabricated using VLSI technology can not robustly tolerate these influences. Third, information access from our devices is straightforward. Finally, this means of information storage is very cost effective and easy to manufacture in large quantities.

A number of variations and modifications of the invention can also be used. For example, the substrates used could be an insulator. The layers could be formed over the insulator using VLSI techniques.

Although the invention is described with reference to specific embodiments thereof, the embodiments are merely illustrative, and not limiting, of the invention, the scope of which is to be determined solely by the appended claims.

What is claimed is:

1. A die with text deposited upon the die using semiconductor processing techniques, the die comprising:
   a substrate which is cut from a semiconductor wafer comprising a plurality of substrates;
   a first paragraph in contact with the substrate; and
   a second paragraph in contact with the substrate and aligned with the first paragraph in a column.

2. The die with text deposited upon the die using semiconductor processing techniques of claim 1, wherein:
   the substrate is a semiconductor substrate; and
   text in the column is comprised of one or more of a metal, an oxide, a polysemiconductor and a photoresist.

3. The die with text deposited upon the die using semiconductor processing techniques of claim 1, wherein the first and second paragraphs are comprised of a plurality of characters.

4. The die with text deposited upon the die using semiconductor processing techniques of claim 3, wherein each of the plurality of characters is comprised of a plurality of primitives.

5. The die with text deposited upon the die using semiconductor processing techniques of claim 1, the die further comprising:
   a first character appearing in a first color; and
   a second character appearing in a second color.

6. The die with text deposited upon the die using semiconductor processing techniques of claim 1, the die further comprising an image on the substrate.

7. The die with text deposited upon the die using semiconductor processing techniques of claim 1, the die further comprising a third paragraph on the substrate, wherein the second and third paragraphs are arranged in two columns on the substrate.

8. The die with text deposited upon the die using semiconductor processing techniques of claim 1, further comprising a silhouette image in contact with the substrate and at least partially overlapping with at least one of the first or second paragraphs.

9. A die with information deposited upon the die using semiconductor processing techniques, the die comprising:
   a substrate which is cut from a semiconductor wafer comprising a plurality of substrates;
   a first paragraph deposited upon the substrate; and
   a second paragraph deposited upon the substrate and aligned with the first paragraph in one or more columns.

10. The die with information deposited upon the die using semiconductor processing techniques of claim 9, wherein the first paragraph is derived from an electronic file that comprises a plurality of elements corresponding to characters for the first paragraphs.

11. The die with information deposited upon the die using semiconductor processing techniques of claim 10, wherein each character of the first and second paragraphs is comprised of a plurality of rectangles wherein one side of the rectangle is equal in size to the process resolution.

12. The die with information deposited upon the die using semiconductor processing techniques of claim 9, wherein the first and second paragraphs are separated by at least one of: a hard return, a tab or an enlarged character.

13. The die with information deposited upon the die using semiconductor processing techniques of claim 9, the die further comprising:
   a first character visible as a first color; and
   a second character visible as a second color, which is different from the first.

14. The die with information deposited upon the die using semiconductor processing techniques of claim 9, further comprising a silhouette image in contact with the substrate and at least partially overlapping with at least one of the first or second paragraphs.

15. The die with information deposited upon the die using semiconductor processing techniques of claim 9, wherein the first paragraph is deposited using a lithographic technique that includes a mask.

16. The die with information deposited upon the die using semiconductor processing techniques of claim 9, wherein the first paragraph is produced with a method comprising steps of:
   converting a first character of the first paragraph into a first pattern;
   converting a second character of the first paragraph into a second pattern; and
   aligning the first and second characters on a line.

17. The die with information deposited upon the die using semiconductor processing techniques of claim 9, wherein the first paragraph is produced with a method comprising a step of determining an end of a first line and beginning a second line.

18. The die with information deposited upon the die using semiconductor processing techniques of claim 9, wherein the column is produced with a method comprising a step of determining an end of the first paragraph and beginning the second paragraph on the next line of the column.

19. The die with information deposited upon the die using semiconductor processing techniques of claim 9, wherein the column is produced with a method comprising a step of detecting an end of a first column and depositing a next line in a second column.

20. The die with information deposited upon the die using semiconductor processing techniques of claim 9, wherein the first paragraph is produced with a method comprising steps of:
   determining a first color for a first character; and
   determining a second color for a second character.

21. A die with information deposited upon the die using semiconductor processing techniques, the die comprising:
   a substrate which is cut from a semiconductor wafer comprising a plurality of substrates arranged in a grid of the semiconductor wafer;
   a paragraph photolithographically deposited upon the substrate; and
   a silhouette image in contact with the substrate and at least partially overlapping with the paragraph.

22. The die with information deposited upon the die using semiconductor processing techniques of claim 21, wherein the paragraph is derived from an electronic file that comprises a plurality of elements corresponding to characters for the paragraphs.

23. The die with information deposited upon the die using semiconductor processing techniques of claim 21, wherein each character of the paragraph is comprised of a plurality of rectangles wherein one side of the rectangle is equal in size to the process resolution.

24. The die with information deposited upon the die using semiconductor processing techniques of claim 21, the die further comprising:
a first character visible as a first color; and
a second character visible as a second color, which is different from the first.

25. The die with information deposited upon the die using semiconductor processing techniques of claim 21, wherein the paragraph is deposited using a lithographic technique that includes a mask.

26. A die with information deposited upon the die using semiconductor processing techniques, the die comprising:
a substrate which is cut from a semiconductor wafer comprising a plurality of substrates arranged in a grid of the semiconductor wafer;
a first paragraph photolithographically deposited upon the substrate;
a second paragraph photolithographically deposited upon the substrate; and
a silhouette image in contact with the substrate and at least partially overlapping at least one of the first or second paragraphs.

27. The die with information deposited upon the die using semiconductor processing techniques of claim 26, the die further comprising:
a first character visible as a first color; and
a second character visible as a second color, which is different from the first.

28. The die with information deposited upon the die using semiconductor processing techniques of claim 26, wherein the first paragraph is deposited using a lithographic technique that includes a mask.

29. A die with information deposited upon the die using semiconductor processing techniques, the die comprising:
a substrate which is cut from a semiconductor wafer comprising a plurality of substrates arranged in a grid of the semiconductor wafer;
a first paragraph photolithographically deposited upon the substrate;
a second paragraph photolithographically deposited upon the substrate wherein at least one of the first or second paragraphs is generated with an electronic file and wherein the first and second paragraphs are comprised of a plurality of characters; and
a silhouette image in contact with the substrate and at least partially overlapping at least one of the first or second paragraphs.

* * * * *